(12) United States Patent
Li et al.

(10) Patent No.: US 11,821,083 B2
(45) Date of Patent: *Nov. 21, 2023

(54) GAS SEPARATION CONTROL IN SPATIAL ATOMIC LAYER DEPOSITION

(71) Applicant: Applied Materials, Inc., Santa Clara, CA (US)

(72) Inventors: Ning Li, San Jose, CA (US); Steven D. Marcus, San Jose, CA (US); Tai T. Ngo, Dublin, CA (US); Kevin Griffin, Livermore, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 85 days.

This patent is subject to a terminal disclaimer.

(21) Appl. No.: 17/563,773

(22) Filed: Dec. 28, 2021

(65) Prior Publication Data

US 2022/0119942 A1 Apr. 21, 2022

Related U.S. Application Data

(63) Continuation of application No. 16/744,560, filed on Jan. 16, 2020, now Pat. No. 11,230,763, which is a continuation of application No. 14/840,485, filed on Aug. 31, 2015, now Pat. No. 10,570,511.

(60) Provisional application No. 62/048,768, filed on Sep. 10, 2014.

(51) Int. Cl.
*C23C 16/44* (2006.01)
*C23C 16/455* (2006.01)

(52) U.S. Cl.
CPC ...... *C23C 16/4412* (2013.01); *C23C 16/4417* (2013.01); *C23C 16/45519* (2013.01); *C23C 16/45544* (2013.01); *C23C 16/45557* (2013.01)

(58) Field of Classification Search
None
See application file for complete search history.

(56) References Cited

U.S. PATENT DOCUMENTS

| | | | | |
|---|---|---|---|---|
| 5,256,205 | A * | 10/1993 | Schmitt, III | C23C 16/513 315/111.21 |
| 6,143,082 | A * | 11/2000 | McInerney | C23C 16/45519 118/730 |
| 10,570,511 | B2 * | 2/2020 | Li | C23C 16/45557 |
| 11,230,763 | B2 * | 1/2022 | Li | C23C 16/4412 |

(Continued)

FOREIGN PATENT DOCUMENTS

| | | |
|---|---|---|
| JP | H0590168 A | 4/1993 |
| JP | 2010080924 A | 4/2010 |

(Continued)

OTHER PUBLICATIONS

"PCT International Preliminary Report on Patentability in PCT/US2015/049137 dated Mar. 23, 2017, 11 pages".

(Continued)

*Primary Examiner* — Karla A Moore
(74) *Attorney, Agent, or Firm* — Servilla Whitney LLC

(57) ABSTRACT

Apparatus and methods for spatial atomic layer deposition including at least one first exhaust system and at least one second exhaust system. Each exhaust system including a throttle valve and a pressure gauge to control the pressure in the processing region associated with the individual exhaust system.

19 Claims, 8 Drawing Sheets

(56) References Cited

U.S. PATENT DOCUMENTS

| | | |
|---|---|---|
| 2004/0025787 A1 | 2/2004 | Selbrede et al. |
| 2007/0215036 A1 | 9/2007 | Park et al. |
| 2008/0041308 A1 | 2/2008 | Hong et al. |
| 2008/0085413 A1 | 4/2008 | Shimoda et al. |
| 2008/0202610 A1 | 8/2008 | Gold et al. |
| 2009/0130780 A1* | 5/2009 | Day .................... C23C 16/4412 118/712 |
| 2009/0304924 A1* | 12/2009 | Gadgil .............. C23C 16/45551 118/718 |
| 2010/0055297 A1 | 3/2010 | Kato et al. |
| 2010/0095890 A1* | 4/2010 | Gebele ................ G05D 16/204 137/12 |
| 2011/0100489 A1 | 5/2011 | Orito et al. |
| 2011/0212625 A1 | 9/2011 | Toyoda et al. |
| 2015/0087140 A1 | 3/2015 | Nozawa et al. |

FOREIGN PATENT DOCUMENTS

| | | |
|---|---|---|
| JP | 2011192772 A | 9/2011 |
| JP | 2011222960 A | 11/2011 |
| WO | 2013161768 A1 | 12/2015 |

OTHER PUBLICATIONS

"PCT International Search Report and Written Opinion in PCT/US2015049137", dated Dec. 17, 2015, 14 pages.

\* cited by examiner

GAS SEPARATION CONTROL IN SPATIAL ATOMIC LAYER DEPOSITION

CROSS-REFERENCE TO RELATED APPLICATIONS

This application is a continuation of U.S. patent application Ser. No. 16/744,560, filed Jan. 16, 2020, which is a continuation of U.S. patent application Ser. No. 14/840,485, filed Aug. 31, 2015, now U.S. Pat. No. 10,570,511, issued Feb. 25, 2020, which claims priority to U.S. Provisional Application No. 62/048,768, filed Sep. 10, 2014, the entire disclosures of which are hereby incorporated by reference herein.

FIELD

Embodiments of the disclosure generally relate to an apparatus for processing substrates. More particularly, embodiments of the disclosure relate to apparatus and methods for controlling the gas separation in a spatial atomic layer deposition chamber.

BACKGROUND

Semiconductor device formation is commonly conducted in substrate processing systems or platforms containing multiple chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

The concept of spatial ALD is based on a clear separation of different gas phase reactive chemicals. Mixing of the chemicals is prevented to avoid gas phase reactions. The general design of a spatial ALD chamber may include a small gap between susceptor (or wafer surface) and gas injector. This gap can be in the range of about 0.5 mm to about 2.5 mm. Vacuum pumping channels are positioned around each chemical showerhead. Inert gas purge channels are between the chemical showerheads to minimize gas phase mixing. In spite of these intrinsic design features, the gas flow and pumping level are managed to avoid gas phase mixing of chemicals from different channels. There is an ongoing need in the art for apparatus and methods for minimizing gas phase mixing.

SUMMARY

One or more embodiments of the disclosure are directed to deposition systems including a processing chamber. The processing chamber has walls defining a chamber volume. The processing chamber includes a susceptor assembly and a gas distribution assembly and has at least one first processing region between the gas distribution assembly and the susceptor assembly and at least one second processing region between the gas distribution assembly and the susceptor assembly. Each of the at least one first processing region and the at least one second processing region are separated by a gas curtain. A chamber exhaust system is in fluid communication with the chamber volume. The chamber exhaust system includes a chamber exhaust throttle valve downstream of the processing chamber. A first exhaust system is in fluid communication with the at least one first processing region. The first exhaust system comprises a first throttle valve and a first pressure gauge. A second exhaust system is in fluid communication with the at least one second processing region. The second exhaust system comprises a second throttle valve and a second pressure gauge. A controller is in communication with the first exhaust system and the second exhaust system to control one or more of the first throttle valve and/or the second throttle valve in response to signals from the first pressure gauge and/or the second pressure gauge.

Additional embodiments of the disclosure are directed to deposition systems comprising a processing chamber. The processing chamber has walls defining a chamber volume and includes a susceptor assembly and a gas distribution assembly. The processing chamber has at least one first processing region, at least one second processing region, at least one third processing region and at least one fourth processing region. Each of the processing regions is positioned between the gas distribution assembly and the susceptor assembly. Each of the processing regions are separated from an adjacent processing region by a gas curtain. A chamber exhaust system is in fluid communication with the chamber volume. The chamber exhaust system includes a chamber exhaust throttle valve downstream of the processing chamber. A first exhaust system is in fluid communication with the at least one first processing region and comprises a first throttle valve and a first pressure gauge. The second exhaust system is in fluid communication with the at least one second processing region and comprises a second throttle valve and a second pressure gauge. A third exhaust system is in fluid communication with the at least one third processing region and comprises a third throttle valve and a third pressure gauge. A fourth exhaust system is in fluid communication with the at least one fourth processing region and comprises a fourth throttle valve and a fourth pressure gauge. A controller is in communication with the first exhaust system, the second exhaust system, the third exhaust system and the fourth exhaust system to control the first throttle valve in response to signals from the first pressure gauge, the second throttle valve in response to signals form the second pressure gauge, the third throttle valve in response to signals from the third pressure gauge and the fourth throttle valve in response to signals from the fourth pressure gauge.

Further embodiments of the disclosure are directed to deposition systems comprising a processing chamber. The processing chamber has walls defining a chamber volume and includes a susceptor assembly and a gas distribution assembly. The processing chamber has at least one first processing region, at least one second processing region, at least one third processing region and at least one fourth processing region. Each of the processing regions is positioned between the gas distribution assembly and the susceptor assembly. Each of the processing regions are separated from an adjacent processing region by a gas curtain. A chamber exhaust system is in fluid communication with the chamber volume. The chamber exhaust system includes a chamber exhaust throttle valve downstream of the processing chamber. A first exhaust system is in fluid communication with the at least one first processing region and comprises a first throttle valve and a first pressure gauge. The second exhaust system is in fluid communication with the at least one second processing region and comprises a second throttle valve and a second pressure gauge. A third exhaust system is in fluid communication with the at least one third processing region and comprises a third throttle valve and a third pressure gauge. A fourth exhaust system is in fluid communication with the at least one fourth processing region and comprises a fourth throttle valve and a fourth pressure gauge. A controller is in communication with the first exhaust system, the second exhaust system, the third exhaust system and the fourth exhaust system to control the first throttle valve in response to signals from the first pressure gauge, the second throttle valve in response to signals form the second pressure gauge, the third throttle valve in response to signals from the third pressure gauge and the fourth throttle valve in response to signals from the fourth pressure gauge. The first pressure gauge is an absolute gauge positioned downstream of the first throttle valve and the second pressure gauge is an absolute gauge positioned downstream of the second throttle valve. The third pressure gauge is a differential gauge measuring a pressure differential relative to the first pressure gauge and the fourth pressure gauge is a differential gauge measuring a pressure differential relative to the second pressure gauge.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide a substrate processing system for continuous substrate deposition to maximize throughput and improve processing efficiency and uniformity. The substrate processing system can also be used for pre-deposition and post-deposition substrate treatments. Embodiments of the disclosure are related to apparatus and methods for increasing deposition uniformity in a batch processor.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. For example, in spatially separated ALD, described with respect to FIG. 1, each precursor is delivered to the substrate, but any individual precursor stream, at any given time, is only delivered to a portion of the substrate. Additionally, reference to depositing on a substrate can mean both a bare substrate and a substrate with one or more films or features deposited or formed thereon.

As used in this specification and the appended claims, the terms "reactive gas", "process gas", "precursor", "reactant", and the like, are used interchangeably to mean a gas that includes a species which is reactive in an atomic layer deposition process. For example, a first "reactive gas" may simply adsorb onto the surface of a substrate and be available for further chemical reaction with a second reactive gas.

Embodiments of the disclosure are directed to methods and apparatus to minimize gas phase mixing in spatial ALD through automatic control of vacuum pumping for each chemical showerhead (channel) in each process region of a batch processing chamber.

Figure 1:
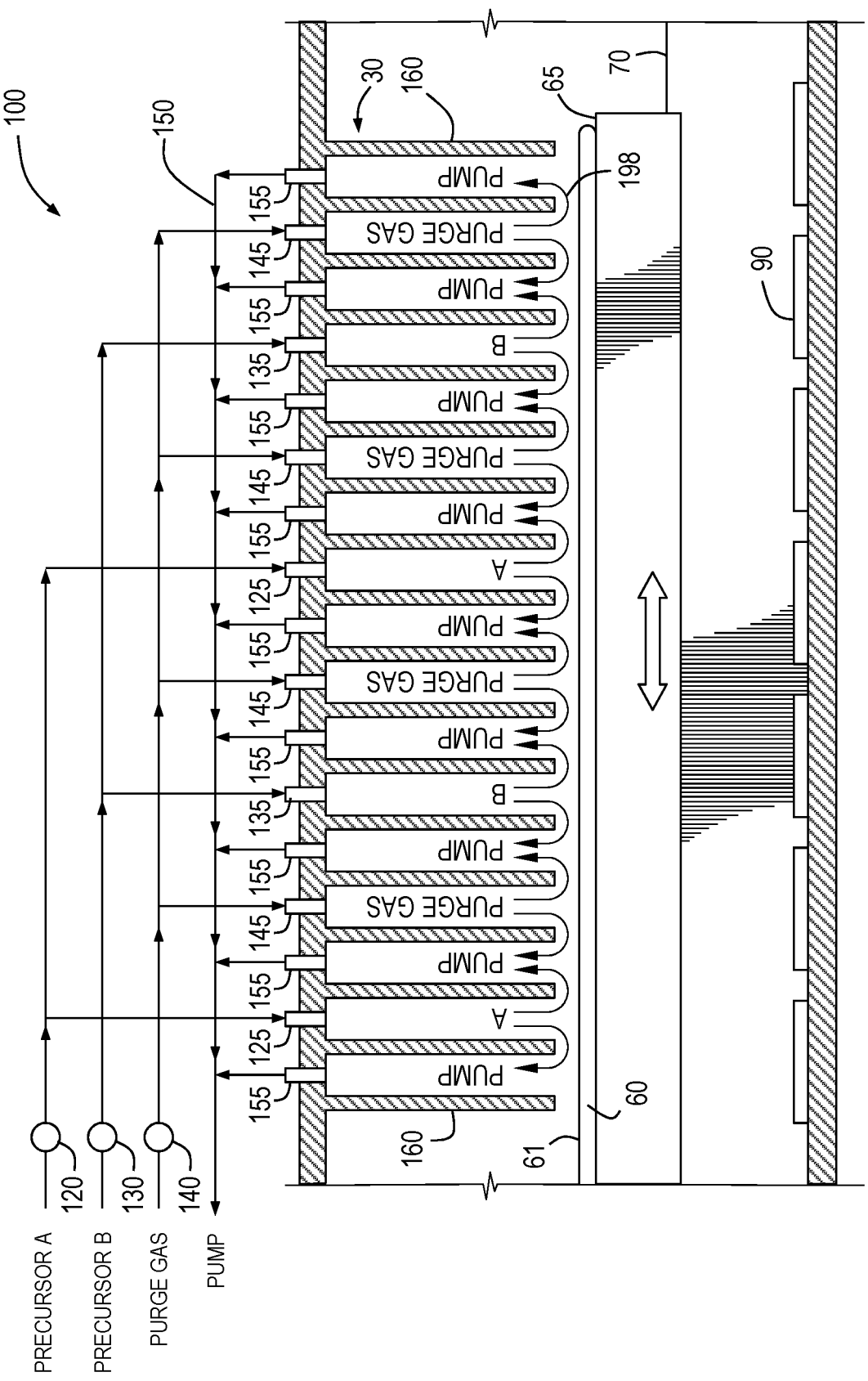
FIG. 1 is a cross-sectional side view of a spatial atomic layer deposition chamber in accordance with one or more embodiment of the disclosure.

FIG. 1 is a schematic cross-sectional view of a portion of a processing chamber 20 in accordance with one or more embodiments of the disclosure. The processing chamber 20 is generally a sealable enclosure, which is operated under vacuum or at least low pressure conditions. The chamber 100 includes a gas distribution assembly 30 capable of distributing one or more gases across the top surface 61 of a substrate 60. The gas distribution assembly 30 can be any suitable assembly known to those skilled in the art, and specific gas distribution assemblies described should not be taken as limiting the scope of the disclosure. The output face of the gas distribution assembly 30 faces the first surface 61 of the substrate 60.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire and silicon carbide.

The gas distribution assembly 30 comprises a plurality of gas ports to transmit one or more gas streams to the substrate 60 and a plurality of vacuum ports disposed between each gas port to transmit the gas streams out of the processing chamber 20. In the embodiment of FIG. 1, the gas distribution assembly 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 injects a continuous (or pulse) stream of a reactive precursor of compound A into the processing chamber 20 through a plurality of gas ports 125. The precursor injector 130 injects a continuous (or pulse) stream of a reactive precursor of compound B into the processing chamber 20 through a plurality of gas ports 135. The purge gas injector 140 injects a continuous (or pulse) stream of a non-reactive or purge gas into the processing chamber 20 through a plurality of gas ports 145. The purge gas removes reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, avoiding cross-contamination between the precursors.

In another aspect, a remote plasma source (not shown) may be connected to the precursor injector 120 and the precursor injector 130 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, it can be either capacitively or inductively coupled. The activation may also be generated by a thermally based technique, a gas breakdown technique, a high energy light source (e.g., UV energy), or exposure to an x-ray source. Exemplary remote plasma sources are available from vendors such as MKS Instruments, Inc. and Advanced Energy Industries, Inc.

The chamber 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The chamber 100 includes a plurality of partitions 160 disposed on the processing chamber 20 between each port. A lower portion of each partition extends close to the first surface 61 of substrate 60, for example, about 0.5 mm or greater from the first surface 61. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the disclosure. Those skilled in the art will understand that the gas distribution system shown is merely one possible distribution system and the other types of showerheads and gas distribution assemblies may be employed.

Figure 2:
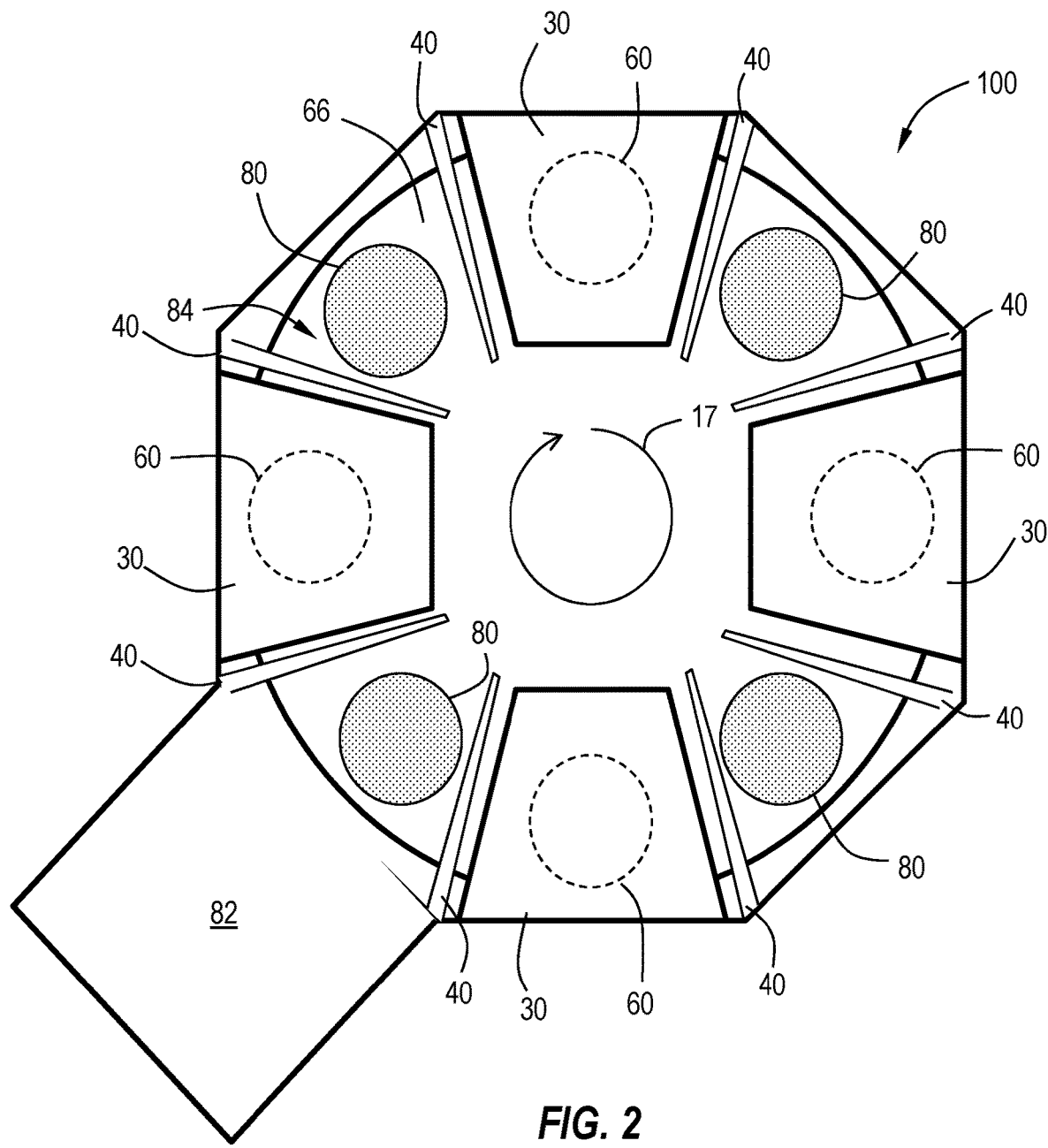
FIG. 2 is a schematic plan view of a substrate processing system configured with four gas distribution assembly units with a loading station in accordance with one or more embodiments of the disclosure.

Atomic layer deposition systems of this sort (i.e., where multiple gases are separately flowed toward the substrate at the same time) are referred to as spatial ALD. In operation, a substrate 60 is delivered (e.g., by a robot) to the processing chamber 20 and can be placed on a shuttle 65 before or after entry into the processing chamber. The shuttle 65 is moved along the track 70, or some other suitable movement mechanism, through the processing chamber 20, passing beneath (or above) the gas distribution assembly 30. In the embodiment shown in FIG. 1, the shuttle 65 is moved in a linear path through the chamber. FIG. 2, as explained further below, shows an embodiment in which wafers are moved in a circular path through a carousel processing system.

Referring back to FIG. 1, as the substrate 60 moves through the processing chamber 20, the first surface 61 of substrate 60 is repeatedly exposed to the reactive gas A coming from gas ports 125 and reactive gas B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the reactive gases or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the substrate surface 110 and around the lower portions of the partitions 160, and finally upward toward the vacuum ports 155. In this manner, each gas may be uniformly distributed across the substrate surface 110. Arrows 198 indicate the direction of the gas flow. Substrate 60 may also be rotated while being exposed to the various gas streams. Rotation of the substrate may be useful in preventing the formation of strips in the formed layers. Rotation of the substrate can be continuous or in discrete steps and can occur while the substrate is passing beneath the gas distribution assembly 30 or when the substrate is in a region before and/or after the gas distribution assembly 30.

In the linear system of FIG. 1, sufficient space is generally provided after the gas distribution assembly 30 to ensure complete exposure to the last gas port. Once the substrate 60 has completely passed beneath the gas distribution assembly 30, the first surface 61 has completely been exposed to every gas port in the processing chamber 20. The substrate can then be transported back in the opposite direction or forward. If the substrate 60 moves in the opposite direction, the substrate surface may be exposed again to the reactive gas A, the purge gas, and reactive gas B, in reverse order from the first exposure.

The extent to which the substrate surface 110 is exposed to each gas may be determined by, for example, the flow rates of each gas coming out of the gas port and the rate of movement of the substrate 60. In one embodiment, the flow rates of each gas are controlled so as not to remove adsorbed precursors from the substrate surface 61. The width between each partition, the number of gas ports disposed on the processing chamber 20, and the number of times the substrate is passed across the gas distribution assembly may also determine the extent to which the substrate surface 61 is exposed to the various gases. Consequently, the quantity and quality of a deposited film may be optimized by varying the above-referenced factors.

Although description of the process has been made with the gas distribution assembly 30 directing a flow of gas downward toward a substrate positioned below the gas distribution assembly, it will be understood that this orientation can be different. In some embodiments, the gas distribution assembly 30 directs a flow of gas upward toward a substrate surface. As used in this specification and the appended claims, the term "passed across" means that the substrate has been moved from one side of the gas distribution assembly to the other side so that the entire surface of the substrate is exposed to each gas stream from the gas distribution plate. Absent additional description, the term "passed across" does not imply any particular orientation of gas distribution assemblies, gas flows or substrate positions.

In some embodiments, the shuttle 65 is a susceptor that can carry multiple substrates. Generally, the susceptor helps to form a uniform temperature across the substrate. The susceptor 66 is movable in both directions (left-to-right and right-to-left, relative to the arrangement of FIG. 1) or in a circular direction (relative to FIG. 2). The susceptor has a top surface for carrying the substrate and may be heated. As an example, the susceptor may be heated by radiant heat lamps 90, a heating plate, resistive coils, or other heating devices, disposed underneath the susceptor or within the susceptor body.

FIG. 1 shows a cross-sectional view of a processing chamber in which the individual gas ports are shown. This embodiment can be either a linear processing system in which the width of the individual gas ports is substantially the same across the entire width of the gas distribution plate, or a pie-shaped segment in which the individual gas ports change width to conform to the pie shape, as described further with respect to FIG. 6.

Processing chambers having multiple gas injectors can be used to process multiple wafers simultaneously so that the wafers experience the same process flow. For example, as shown in FIG. 2, the processing chamber 100 has four gas distribution assemblies 30 and four substrates 60. At the outset of processing, the substrates 60 can be positioned between the gas distribution assemblies 30. Rotating the susceptor 66 of the carousel by 45° will result in each substrate 60 being moved to an injector assembly 30 for film deposition. This is the position shown in FIG. 2. An additional 45° rotation would move the substrates 60 away from the gas distribution assemblies 30. With spatial ALD injectors, a film is deposited on the wafer during movement of the wafer relative to the injector assembly. In some embodiments, the susceptor 66 is rotated so that the substrates 60 do not stop beneath the gas distribution assemblies 30. The number of substrates 60 and gas distribution assemblies 30 can be the same or different. In some embodiments, there is the same number of wafers being processed as there are gas distribution assemblies. In one or more embodiments, the number of wafers being processed are an integer multiple of the number of gas distribution assemblies. For example, if there are four gas distribution assemblies, there are 4x wafers being processed, where x is an integer value greater than or equal to one.

The processing chamber 100 shown in FIG. 2 is merely representative of one possible configuration and should not be taken as limiting the scope of the disclosure. Here, the processing chamber 100 includes a plurality of gas distribution assemblies 30. In the embodiment shown, there are four gas distribution assemblies 30 evenly spaced about the processing chamber 100. The processing chamber 100 shown is octagonal, however, it will be understood by those skilled in the art that this is one possible shape and should not be taken as limiting the scope of the disclosure. Additionally, each segment can be configured to deliver gases in a spatial type arrangement with multiple different reactive gases flowing from the same segment or configured to deliver a single reactive gas or a mixture of reactive gases.

The processing chamber 100 includes a substrate support apparatus, shown as a round susceptor 66 or susceptor assembly. The substrate support apparatus, or susceptor 66, is capable of moving a plurality of substrates 60 beneath each of the gas distribution assemblies 30. A load lock 82 might be connected to a side of the processing chamber 100 to allow the substrates 60 to be loaded/unloaded from the chamber 100.

The processing chamber 100 may include a plurality, or set, of first treatment stations 80 positioned between any or each of the plurality of gas distribution assemblies 30. In some embodiments, each of the first treatment stations 80 provides the same treatment to a substrate 60.

The number of treatment stations and the number of different types of treatment stations can vary depending on the process. For example, there can be one, two, three, four, five, six, seven or more treatment stations positioned between the gas distribution assemblies 30. Each treatment stations can independently provide a different treatment from every other set of treatments station, or there can be a mixture of the same type and different types of treatments. In some embodiments, one or more of the individual treatments stations provides a different treatment than one or more of the other individual treatment stations. While the embodiment shown in FIG. 2 shows four gas distribution assemblies with spaces between which can include some type of treatment station, those skilled in the art will understand that the processing chamber can readily be incorporated with eight gas distribution assemblies with the gas curtains between.

Treatment stations can provide any suitable type of treatment to the substrate, film on the substrate or susceptor assembly. For example, UV lamps, flash lamps, plasma sources and heaters. The wafers are then moved between positions with the gas distribution assemblies 30 to a position with, for example, a showerhead delivering plasma to the wafer. The plasma station being referred to as a treatment station 80. In one or more example, silicon nitride films can be formed with plasma treatment after each deposition layer. As the ALD reaction is, theoretically, self-limiting as long as the surface is saturated, additional exposure to the deposition gas will not cause damage to the film.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the substrate can pause again. Pausing between the injectors may provide time for additional processing steps between each layer deposition (e.g., exposure to plasma).

In some embodiments, the processing chamber comprises a plurality of gas curtains 40. Each gas curtain 40 creates a barrier to prevent, or minimize, the movement of processing gases from the gas distribution assemblies 30 from migrating from the gas distribution assembly regions and gases from the treatment stations 80 from migrating from the treatment station regions. The gas curtain 40 can include any suitable combination of gas and vacuum streams which can isolate the individual processing sections from the adjacent sections. In some embodiments, the gas curtain 40 is a purge (or inert) gas stream. In one or more embodiments, the gas curtain 40 is a vacuum stream that removes gases from the processing chamber. In some embodiments, the gas curtain 40 is a combination of purge gas and vacuum streams so that there are, in order, a purge gas stream, a vacuum stream and a purge gas stream. In one or more embodiments, the gas curtain 40 is a combination of vacuum streams and purge gas streams so that there are, in order, a vacuum stream, a purge gas stream and a vacuum stream. The gas curtains 40 shown in FIG. 2 are positioned between each of the gas distribution assemblies 30 and treatment stations 80, but it will be understood that the curtains can be positioned at any point or points along the processing path.

Figure 3:
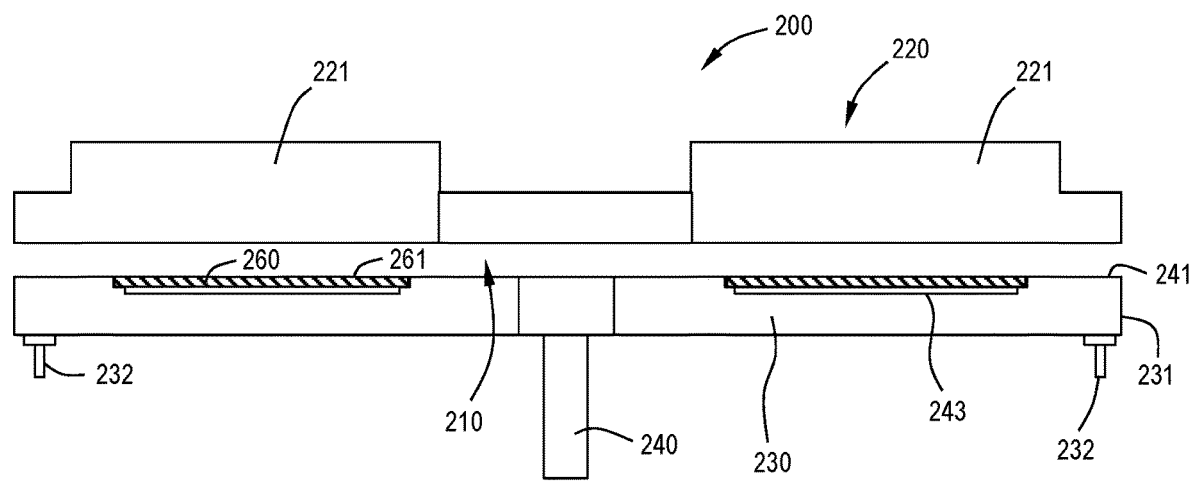
FIG. 3 shows a cross-sectional view of a processing chamber in accordance with one or more embodiments of the disclosure.

FIG. 3 shows an embodiment of a processing chamber 200 including a gas distribution assembly 220, also referred to as the injectors, and a susceptor assembly 230. In this embodiment, the susceptor assembly 230 is a rigid body. The rigid body of some embodiments has a droop tolerance no larger than 0.05 mm. Actuators 232 may be placed, for example, at three locations at the outer diameter region of the susceptor assembly 230. As used in this specification and the appended claims, the terms "outer diameter" and "inner diameter" refer to regions near the outer peripheral edge and the inner edge, respectively. The outer diameter is not to a specific position at the extreme outer edge (e.g., near shaft 240) of the susceptor assembly 230, but is a region near the outer edge 231 of the susceptor assembly 230. This can be seen in FIG. 3 from the placement of the actuators 232. The number of actuators 232 can vary from one to any number that will fit within the physical space available. Some embodiments have two, three, four or five sets of actuators 232 positioned in the outer diameter region 231. As used in this specification and the appended claims, the term "actuator" refers to any single or multi-component mechanism which is capable of moving the susceptor assembly 230, or a portion of the susceptor assembly 230, toward or away from the gas distribution assembly 220. For example, actuators 232 can be used to ensure that the susceptor assembly 230 is substantially parallel to the gas distribution assembly 220. As used in this specification and the appended claims, the term "substantially parallel" used in this regard means that the parallelism of the components does not vary by more than 5% relative to the distance between the components.

Once pressure is applied to the susceptor assembly 230 from the actuators 232, the susceptor assembly 230 can be levelled. As the pressure is applied by the actuators 232, the gap 210 distance can be set to be within the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The susceptor assembly 230 is positioned beneath the gas distribution assembly 220. The susceptor assembly 230 includes a top surface 241 and, optionally, at least one recess 243 in the top surface 241. The recess 243 can be any suitable shape and size depending on the shape and size of the wafers 260 being processed. In the embodiment shown, the recess 243 has a step region around the outer peripheral edge of the recess 243. The steps can be sized to support the outer peripheral edge of the wafer 260. The amount of the outer peripheral edge of the wafer 260 that is supported by the steps can vary depending on, for example, the thickness of the wafer and the presence of features already present on the back side of the wafer.

In some embodiments, as shown in FIG. 3, the recess 243 in the top surface 241 of the susceptor assembly 230 is sized so that a wafer 260 supported in the recess 243 has a top surface 261 substantially coplanar with the top surface 241 of the susceptor assembly 230. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 230 of FIG. 3 includes a support post 240 which is capable of lifting, lowering and rotating the susceptor assembly 230. The susceptor assembly 230 may include a heater, or gas lines, or electrical components within the center of the support post 240. The support post 240 may be the primary means of increasing or decreasing the gap between the susceptor assembly 230 and the gas distribution assembly 220, moving the susceptor assembly 230 into rough position. The actuators 232 can then make micro-adjustments to the position of the susceptor assembly to create the predetermined gap.

Figure 4:
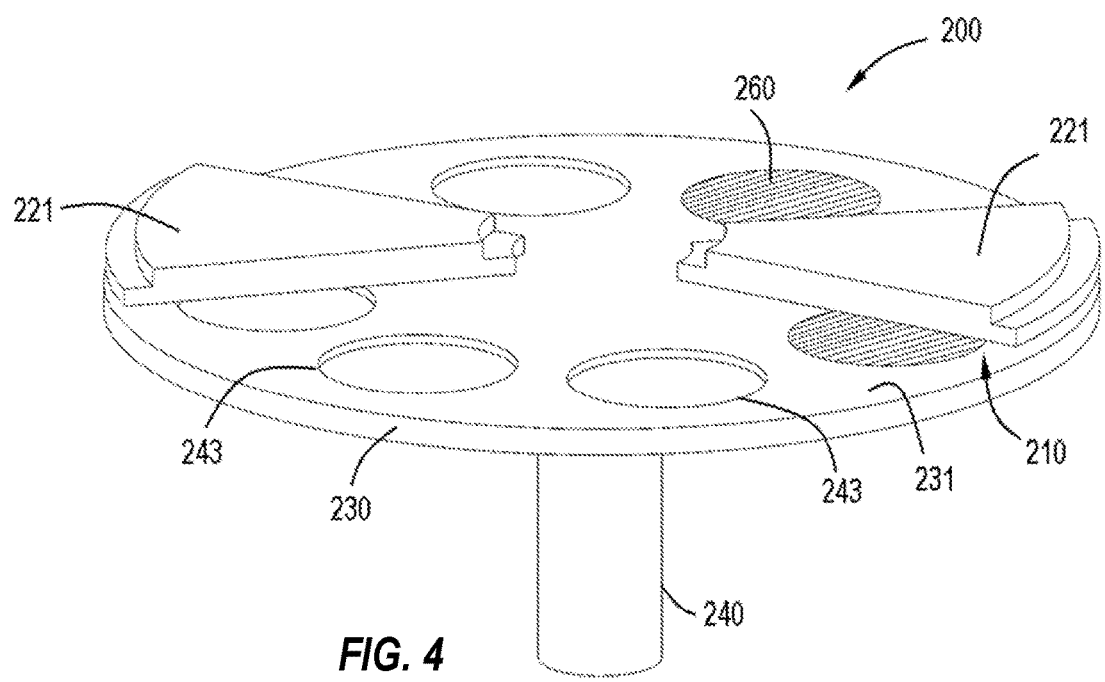
FIG. 4 shows a perspective view of a susceptor assembly and gas distribution assembly units in accordance with one or more embodiments of the disclosure.

The processing chamber 100 shown in FIG. 3 is a carousel-type chamber in which the susceptor assembly 230 can hold a plurality of wafers 260. The gas distribution assembly 220 may include a plurality of separate injector units 221, each injector unit 221 being capable of depositing a film or part of a film on the wafer 260, as the wafer is moved beneath the injector unit 221. FIG. 4 shows a perspective view of a carousel-type processing chamber 200. Two pie-shaped injector units 221 are shown positioned on approximately opposite sides of and above the susceptor assembly 230. This number of injector units 221 is shown for illustrative purposes only. It will be understood that more or less injector units 221 can be included. In some embodiments, there are a sufficient number of pie-shaped injector units 221 to form a shape conforming to the shape of the susceptor assembly 230. In some embodiments, each of the individual pie-shaped injector units 221 may be independently moved, removed and/or replaced without affecting any of the other injector units 221. For example, one segment may be raised to permit a robot to access the region between the susceptor assembly 230 and gas distribution assembly 220 to load/unload wafers 260.

Figure 5:
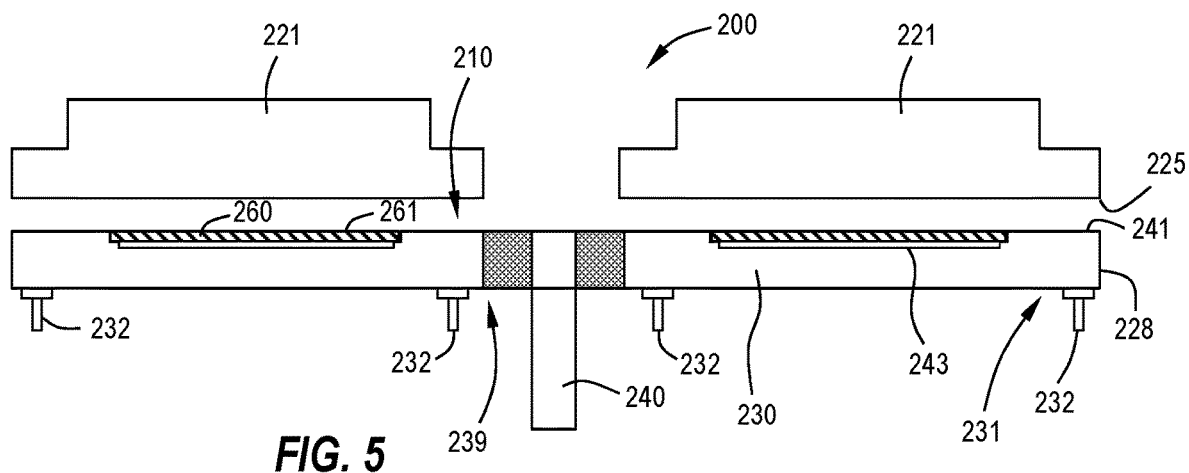
FIG. 5 shows a cross-sectional view of a processing chamber in accordance with one or more embodiments of the disclosure.

FIG. 5 shows another embodiment of the disclosure in which the susceptor assembly 230 is not a rigid body. In some embodiments, the susceptor assembly 230 has a droop tolerance of not more than about 0.1 mm, or not more than about 0.05 mm, or not more than about 0.025 mm, or not more than about 0.01 mm. Here, there are actuators 232 placed at the outer diameter region 231 and at the inner diameter region 239 of the susceptor assembly 230. The actuators 232 can be positioned at any suitable number of places around the inner and outer periphery of the susceptor assembly 230. In some embodiments, the actuators 232 are placed at three locations at both the outer diameter region 231 and the inner diameter region 239. The actuators 232 at both the outer diameter region 231 and the inner diameter region 239 apply pressure to the susceptor assembly 230.

Figure 6:
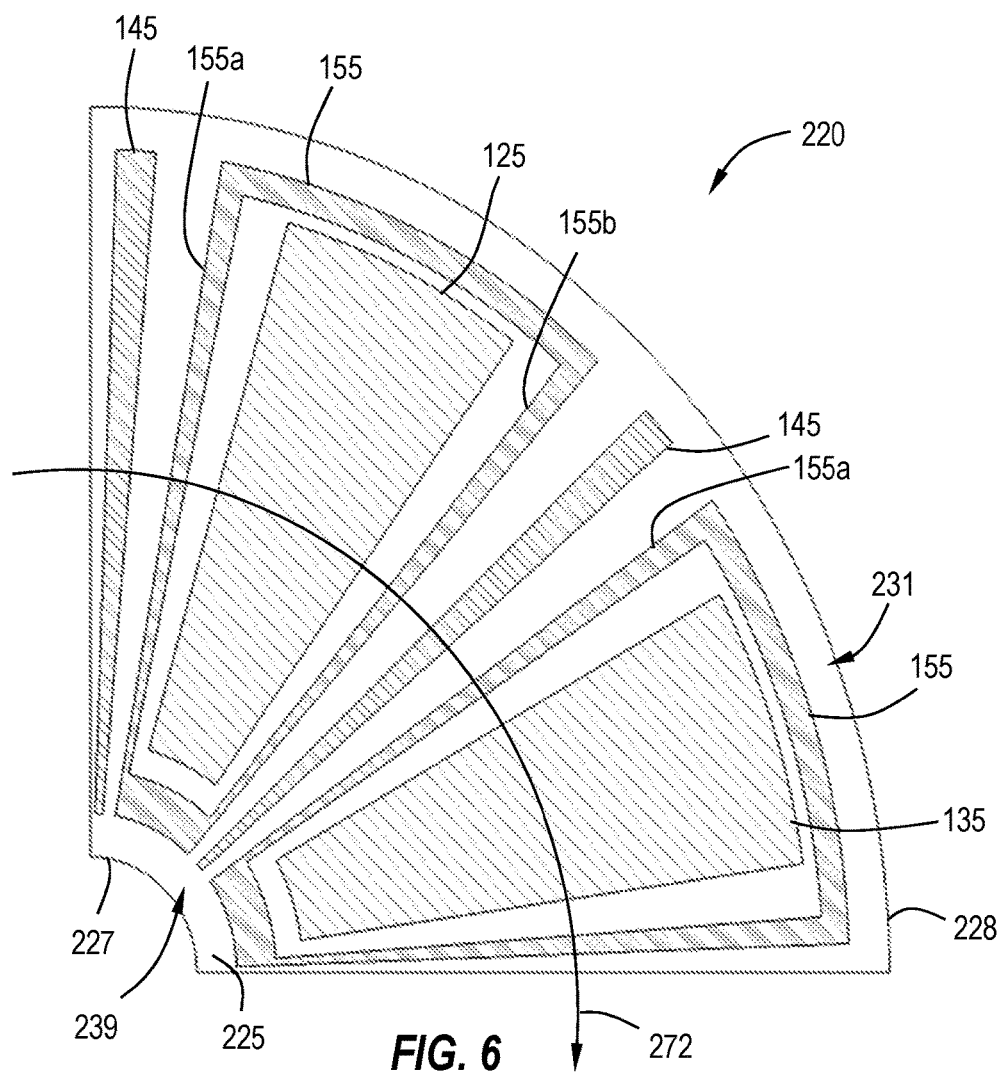
FIG. 6 shows a schematic of a pie-shaped gas distribution assembly in accordance with one or more embodiments of the disclosure.

FIG. 6 shows a gas distribution assembly 220 in accordance with one or more embodiment of the disclosure. The front face 225 of a portion or segment of a generally circular gas distribution assembly 220 is shown. As used in this specification and the appended claims, the term "generally circular" means that the overall shape of the component does not have any angles less than 80°. Thus, generally circular can have any shape including square, pentagonal, hexagonal, heptagonal, octagonal, etc. Generally circular should not be taken as limiting the shape to a circle or perfect polygon, but can also include oval and imperfect polygons. The gas distribution assembly 220 includes a plurality of elongate gas ports 125, 135, 145 in the front face 225. The gas ports extend from the inner diameter region 239 to an outer diameter region 231 of the gas distribution assembly 220.

The shape or aspect ratio of the individual ports can be proportional to, or different from, the shape or aspect ratio of the gas distribution assembly segment. In some embodiments, the individual ports are shaped so that each point of a wafer passing across the gas distribution assembly 220 following path 272 would have about the same residence time under each gas port. The path of the substrates can be perpendicular to the gas ports. In some embodiments, each of the gas distribution assemblies comprises a plurality of elongate gas ports which extend in a direction substantially perpendicular to the path traversed by a substrate. As used in this specification and the appended claims, the term "substantially perpendicular" means that the general direction of movement is approximately perpendicular to the axis of the gas ports. For a pie-shaped gas port, the axis of the gas port can be considered to be a line defined as the mid-point of the width of the port extending along the length of the port. Each of the individual pie-shaped segments can be configured to deliver a single reactive gas or multiple reactive gases separated spatially or in combination (e.g., as in a typical CVD process).

The plurality of gas ports include a first reactive gas port 125 to deliver a first reactive gas to the processing chamber and a purge gas port 145 to deliver a purge gas to the processing chamber. The embodiment shown in FIG. 6 also includes a second reactive gas port 135 to deliver a second reactive gas to the processing chamber.

A vacuum port 155 separates the first reactive gas port 125 and second reactive gas port 135 from the adjacent purge gas ports 145. Stated differently, the vacuum port is positioned between the first reactive gas port 125 and the purge gas port 145 and between the second reactive gas port 135 and the purge gas port 145. The vacuum ports evacuate gases from the processing chamber. In the embodiment shown in FIG. 6, the vacuum ports 155 extend around all sides of the reactive gas ports so that there is a portion of the vacuum port 155 on the inner peripheral edge 227 and outer peripheral edge 228 of each of the first reactive gas port 125 and second reactive gas port 135.

In use, a substrate is passed adjacent the gas distribution plate 220 along path 272. In transit, the substrate will encounter gas flows, either flowing into the chamber or out of the chamber, in order, a purge gas port 145, a first vacuum port 155a, a first reactive gas port 125, a second vacuum port 155b, a purge gas port 145, a first vacuum port 155a, a second reactive gas port 135 and a second vacuum port 155b. The first vacuum port 155a and second vacuum port 155b are shown connected as a single vacuum port 155.

Figure 7:
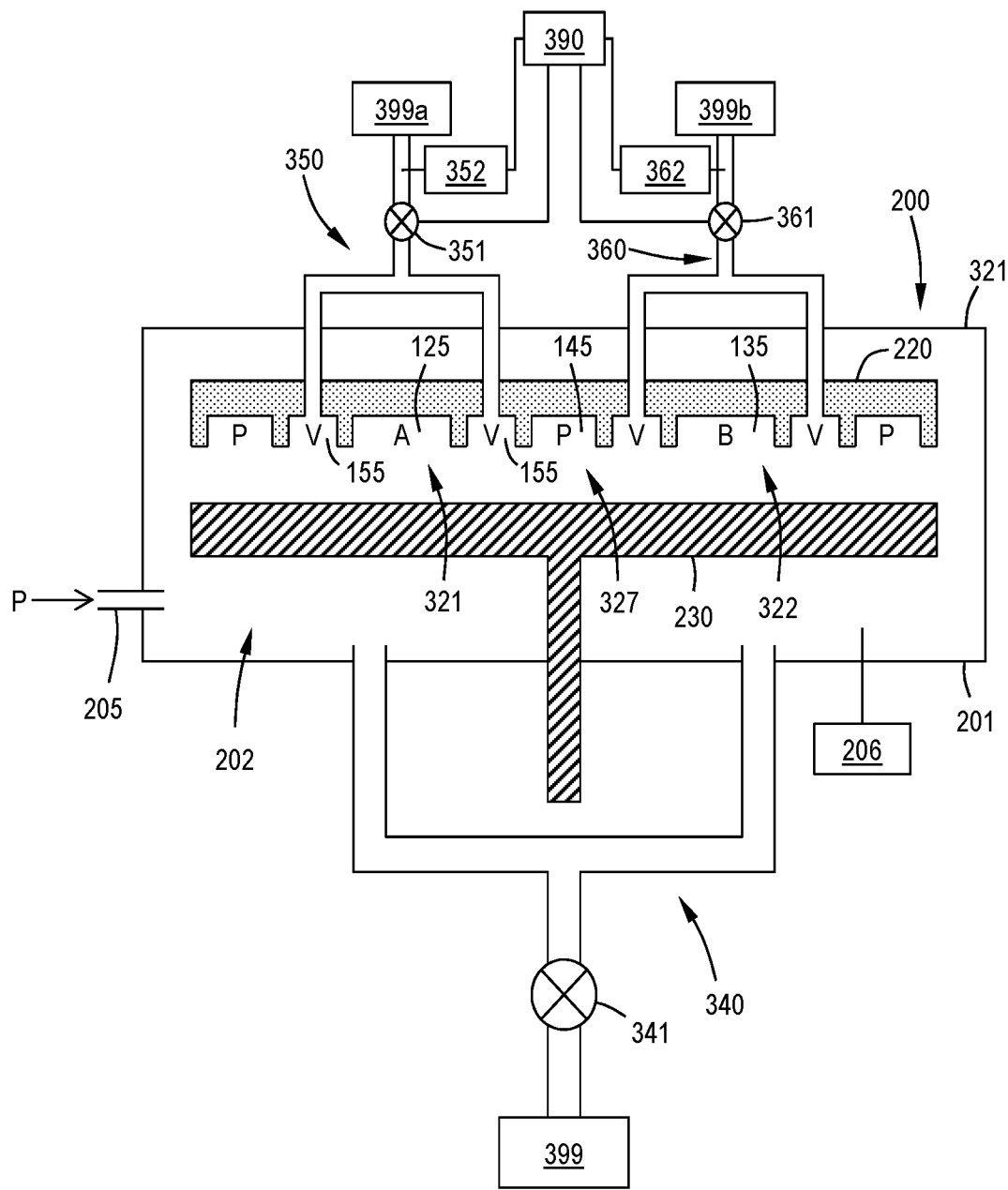
FIG. 7 shows a schematic of a processing chamber in accordance with one or more embodiment of the disclosure.

FIG. 7 shows a schematic of a spatial atomic layer deposition chamber in accordance with one or more embodiment of the disclosure. As can be seen, there is one pump for chamber pumping and two other pumps for injector (gas distribution assembly) pumping. Additionally, one inert purge gas goes to the chamber volume and several different gases (inert gases and reactive chemicals) go to the gas distribution assembly.

The chamber purge 205 flows an inert purge gas into the chamber to pressurize the chamber space outside of the reaction area located between the susceptor assembly and the gas distribution assembly. A chamber throttle valve is used to control the pressure of the chamber. The pressure in the chamber can be measured using gauge 206.

Chemical precursor A and B flow into the chamber through independent chemical channels in the injector (gas distribution assembly). Each chemical channel is surrounded by vacuum pumping channels. An inert gas purge curtain is positioned between chemical channels to maintain separation of the reactive gases.

The throttle valve control for pumping channel A and B may use foreline pressure control, which means that the throttle valves adjust angles to reach the pressure setpoint at downstream of the throttle valve. This is the opposite of a typical pressure control mechanism where pressure upstream of the throttle valve is controlled. The downstream/foreline pressure control for A and B pumping lines may help ensure that the amount of gases pumped out of each pumping channel is equal to the gas amount flowing into that channel and may include part of the inert separation gas. In total, the amount of gases flowing in the chamber through the gas distribution assembly should be pumped out of the chamber by pumps A and B.

A typical relationship between the foreline pressure reading and the actual gas flowing into that pump is basically a straight line. This coincides with the law of conservation of mass. Theoretically, the gas throughput (Q, Torr L/s) to the pump has a linear relationship with the pump foreline pressure (P, torr) and the slope is the pumping speed (C, L/s), where $Q=C \times P$. Practically, the curve shape will depend on the vacuum pump speed, gas species, the physical location of the foreline pressure gauge, and the real gas temperature as detected by foreline pressure gauge, etc. One or more embodiments of the disclosure advantageously provide consistent gas pressure control. In some embodiments, the processing system automatically monitors the data curve for different chamber conditions and controls the foreline pressure based on the real flow of gases. One or more embodiments advantageously provide control of the foreline pressure to manage gas pressure in the processing regions of the processing chamber. One or more embodiments of the disclosure advantageously provide control of the gas flows to minimize gas phase reactions.

Still referring to FIG. 7, one or more embodiments of the disclosure are directed to processing chambers 200 having walls 201 defining a chamber volume 202. The embodiment shown in FIG. 7 is a schematic representation of a generally circular processing system, like that shown in FIG. 4. The processing chamber 200 includes a susceptor assembly 230 and a gas distribution assembly 220. There is at least one first processing region 321 and at least one second processing region 322. As shown in FIG. 7, the first processing region 321 is associated with the first process gas, denoted A, and the second processing region 322 is associated with the second process gas, denoted B. Those skilled in the art will understand that this is merely illustrative of one possible arrangement and should not be taken as limiting the scope of the disclosure. Each of the first processing region 321 and second processing region 322 are positioned between the gas distribution assembly 220 and the susceptor assembly 230. Each of the first processing region 321 and second processing region 322 are separated by a gas curtain 327. The gas curtain can be any suitable combination of gases and vacuum that prevent or minimize mixing of the first process gas A and the second process gas B.

A chamber exhaust system 340 is in fluid communication with the chamber volume 202. The chamber exhaust system 340 maintains a reduced pressure state in the chamber volume. The pressure in the chamber volume 202 can be the same as, or different from the pressure in the first processing region 321 and the second processing region 322. The chamber exhaust system 340 includes a chamber exhaust throttle valve 341 positioned downstream of the processing chamber 200. As used herein, the terms "upstream" and "downstream" refer to relative directions according to the flow of an exhaust gas stream from the interior of the processing chamber. Downstream of the chamber exhaust throttle valve 341 is a vacuum source 399. The vacuum source 399 can be any suitable vacuum source including, but not limited to, a house vacuum or an individual vacuum pump.

The processing chamber includes a first exhaust system 350 in fluid communication with the at least one first processing region 321. The first exhaust system 350 shown in FIG. 7 includes a vacuum port 155 that extends on either side of the first process gas A port 125. As shown in FIG. 6, the vacuum port can extend around all four sides of the process gas A port 125. The first exhaust system 350 comprises a first throttle valve 351 and a first pressure gauge 352. The embodiment shown in FIG. 7 has the first pressure gauge 352 positioned downstream of the first throttle valve 351, but this is merely representative of one possible arrangement. The first exhaust system 350 connects to a suitable vacuum source which can be the same as vacuum source 399 or different.

The processing chamber 200 includes a second exhaust system 360 in fluid communication with the at least one second processing region 322. The second exhaust system 360 shown in FIG. 7 includes a vacuum port 155 that extends on either side of the second process gas B port 135. As shown in FIG. 6, the vacuum port can extend around all four sides of the process gas B port 135. The second exhaust system 360 comprises a second throttle valve 361 and a second pressure gauge 362. The embodiment shown in FIG. 7 has the second pressure gauge 362 positioned downstream of the second throttle valve 361, but this is merely representative of one possible arrangement. The second exhaust system 360 connects to a suitable vacuum source which can be the same as vacuum source 399 or different.

A controller 390 is in communication with the first exhaust system 350 and the second exhaust system 360. The controller 390 can control the first throttle valve 351 in response to signals from the first pressure gauge 352 and can control the second throttle valve 361 in response to signals from the second pressure gauge 362. In some embodiments, the controller 390 maintains separation of gases in the first processing region 321 and the second processing region 322 by opening/closing the throttle valves in response to measurements from the pressure gauges. A controller 390 can be any suitable controller comprising one or more of hardware, firmware and/or software. In some embodiments, the controller 390 includes a computer with one or more of a central processing unit, memory, storage and/or circuits configured to communicate with the physical components associated with the processing chamber. For example, the computer may include computer readable instructions on computer readable media that allows a user to input processing parameters including, but not limited to, gas pressures, flow rates and pressure differential tolerances.

Figure 8A:
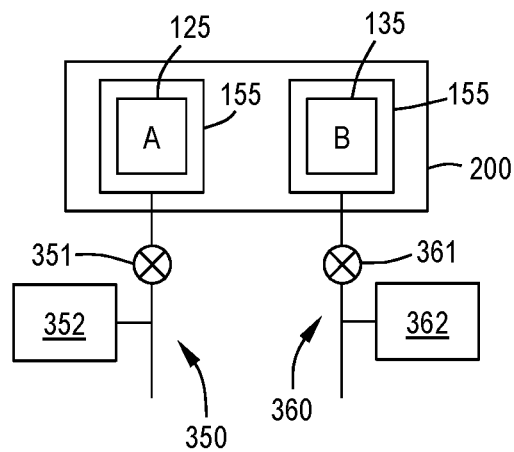
FIGS. 8A through 8C show schematic views of a processing chamber in accordance with one or more embodiment of the disclosure.

FIG. 8A shows a schematic representation of a processing chamber in accordance with FIG. 7. The first process gas A and second process gas B are schematically represented by a square indicating the boundaries of the gas ports 125, 135. A vacuum port 155, also represented as a square, is shown around each of the gas ports 125, 135. This schematic representation is merely exemplary and should not be taken as implying or limiting the shape or width of the gas ports or vacuum ports. The embodiment shown in FIG. 8A has the first pressure gauge 352 positioned downstream of the first throttle valve 251 and the second pressure gauge 362 positioned downstream of the second throttle valve 361. While not shown, it will be understood that a controller, like that of FIG. 7 can also be included.

In the embodiments shown in FIGS. 7 and 8A, the controller 390 monitors the pressure in the exhaust line downstream of the throttle valves 351, 361. If the pressure in the exhaust line is too low, the pressure in the process region is too high and the controller will cause the appropriate throttle valve to open further. If the pressure in the exhaust line is too high, the pressure in the process region is too low and the controller will partially close the appropriate throttle valve. The controller 390 may also close the throttle valves completely to isolate the chamber volume 202.

Figure 8B:
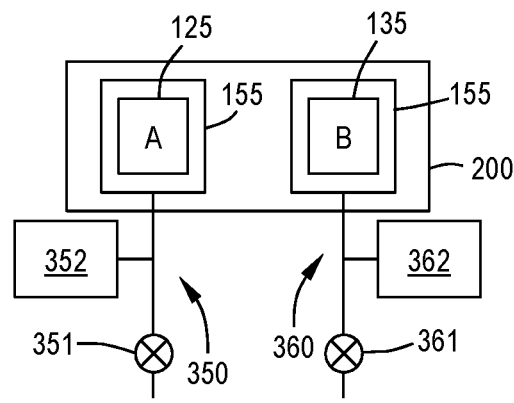

The embodiment shown in FIG. 8B has the first pressure gauge 352 positioned upstream of the first throttle valve 351 and the second pressure gauge 362 positioned upstream of the second throttle valve 361. In the embodiment shown in FIG. 8B, the controller monitors the pressure in the exhaust line upstream of the throttle valves. The pressure gauges here are positioned on the processing chamber side of the throttle valve. If the pressure in the exhaust line is too low, the pressure in the process region is too low and the controller will cause the appropriate throttle valve to move toward the closed position. If the pressure in the exhaust line is too high, the pressure in the process region is too high and the controller will cause the appropriate throttle valve to open further.

The pressure gauges employed can be any suitable pressure gauges. In some embodiments, the pressure gauges are absolute gauges referenced to either a perfect vacuum or to conditions outside of the processing chamber. In some embodiments, differential pressure gauges are used. A differential pressure gauge measures the difference in pressure between two points.

Figure 8C:
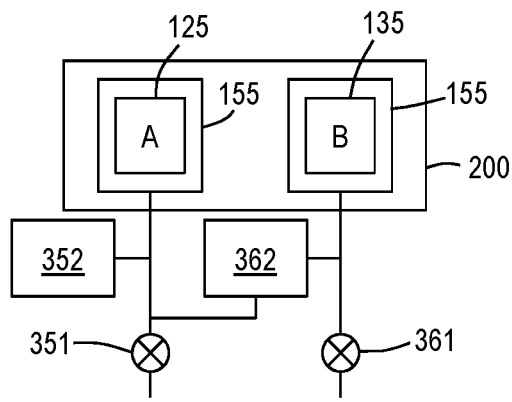

In some embodiments, the pressure gauges are upstream of the controller determines the difference in pressure measured by the second pressure gauge relative to the first pressure gauge. In one or more embodiments, as shown in FIG. 8C, the first pressure gauge is an absolute gauge and the second pressure gauge is a differential pressure gauge measuring pressure relative to the pressure in the first exhaust system.

In some embodiments, the controller 390 adjust the gas flow in the processing regions so that the absolute pressure differential between the first processing region 321 and the second processing region 322 is up to about 5 torr. In some embodiments, the controller 390 is configured to adjust the gas flow in one or more of the processing regions so that the difference between the pressures, either differential or absolute, is less than or equal to about 5 torr, 4 torr, 3 torr or 2 torr.

Figure 9:
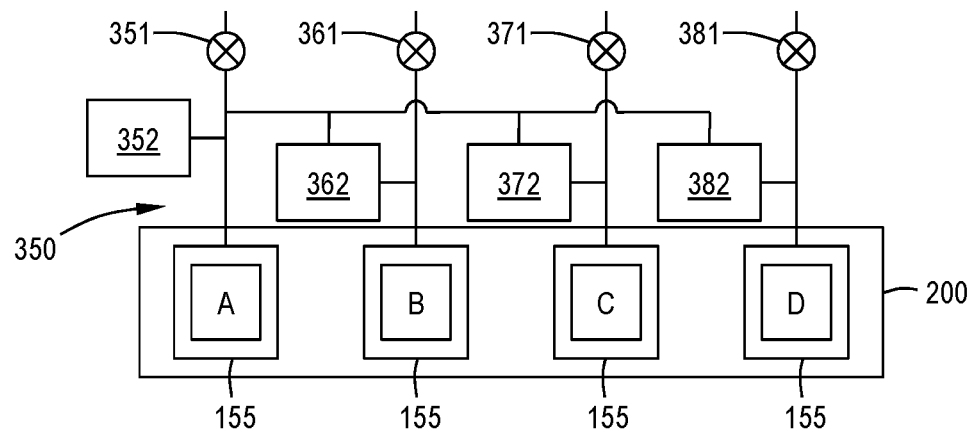
FIG. 9 shows a schematic view of a processing chamber in accordance with one or more embodiment of the disclosure.

FIG. 9 shows another embodiment of a processing chamber 200. The processing chamber 200 includes a first processing region 321 adjacent the first process gas A port, a second processing region 322 adjacent the second process gas B port, a third processing region 323 adjacent a third process gas C port and a fourth processing region 324 adjacent a fourth process gas D port. The processing regions are described as being adjacent the respective gas ports but it will be understood that the process region is between the gas distribution assembly and the susceptor assembly. Each of the at least one first processing region 321, the at least one second processing region 322, the at least one third processing region 323 and the at least one fourth processing region 324 are separated by gas curtains 325.

A third exhaust system 370 is in fluid communication with the at least one third processing region 323. The third exhaust system 370 comprising a third throttle valve 371 and a third pressure gauge 372. A fourth exhaust system 380 is in fluid communication with the fourth processing region 324. The fourth exhaust system 380 includes a fourth throttle valve 381 and a fourth pressure gauge 382.

The controller (not shown) is in communication with the first exhaust system 350, the second exhaust system 360, the third exhaust system 370 and the fourth exhaust system 380 to control throttle valves 351, 361, 371, 381 in response to signals from the first pressure gauge 352, the second pressure gauge 362, the third pressure gauge 372 and the fourth pressure gauge 382.

Figure 10:
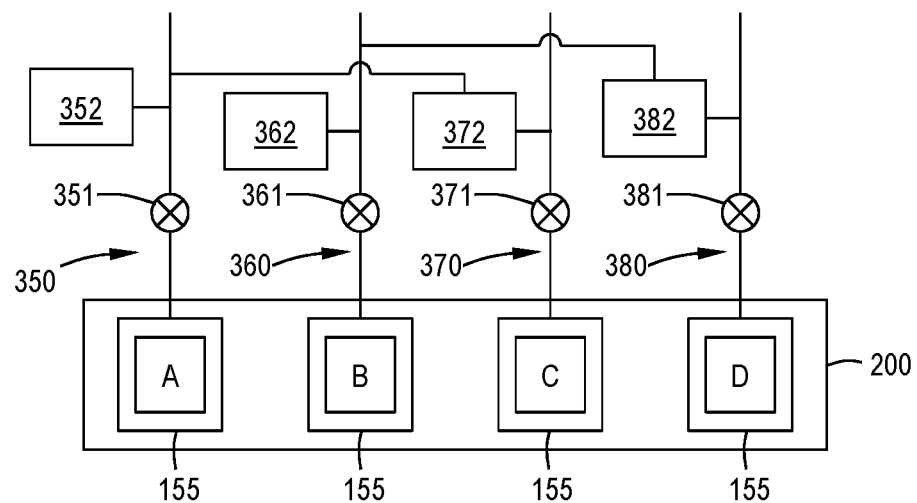
FIG. 10 shows a schematic view of a processing chamber in accordance with one or more embodiment of the disclosure.

In the embodiment shown in FIG. 9, the first pressure gauge 352 is downstream of the first throttle valve 351, the second pressure gauge 362 is downstream of the second throttle valve 361, the third pressure gauge 372 is downstream of the third throttle valve 371 and the fourth pressure gauge 382 is downstream of the fourth throttle valve 381. In the embodiment shown in FIG. 10, the first pressure gauge 352 is upstream of the first throttle valve 351, the second pressure gauge 362 is upstream of the second throttle valve 361, the third pressure gauge 372 is upstream of the third throttle valve 371 and the fourth pressure gauge 382 is upstream of the fourth throttle valve 381.

In some embodiments, each of the first pressure gauge 352, the second pressure gauge 362, the third pressure gauge 372 and the fourth pressure gauge 382 are absolute gauges. In one or more embodiments, the controller 390 determines a difference in pressure measured by one or more of the second pressure gauge 362, the third pressure gauge 372 or the fourth pressure gauge 382 relative to the first pressure gauge 352.

Figure 11:
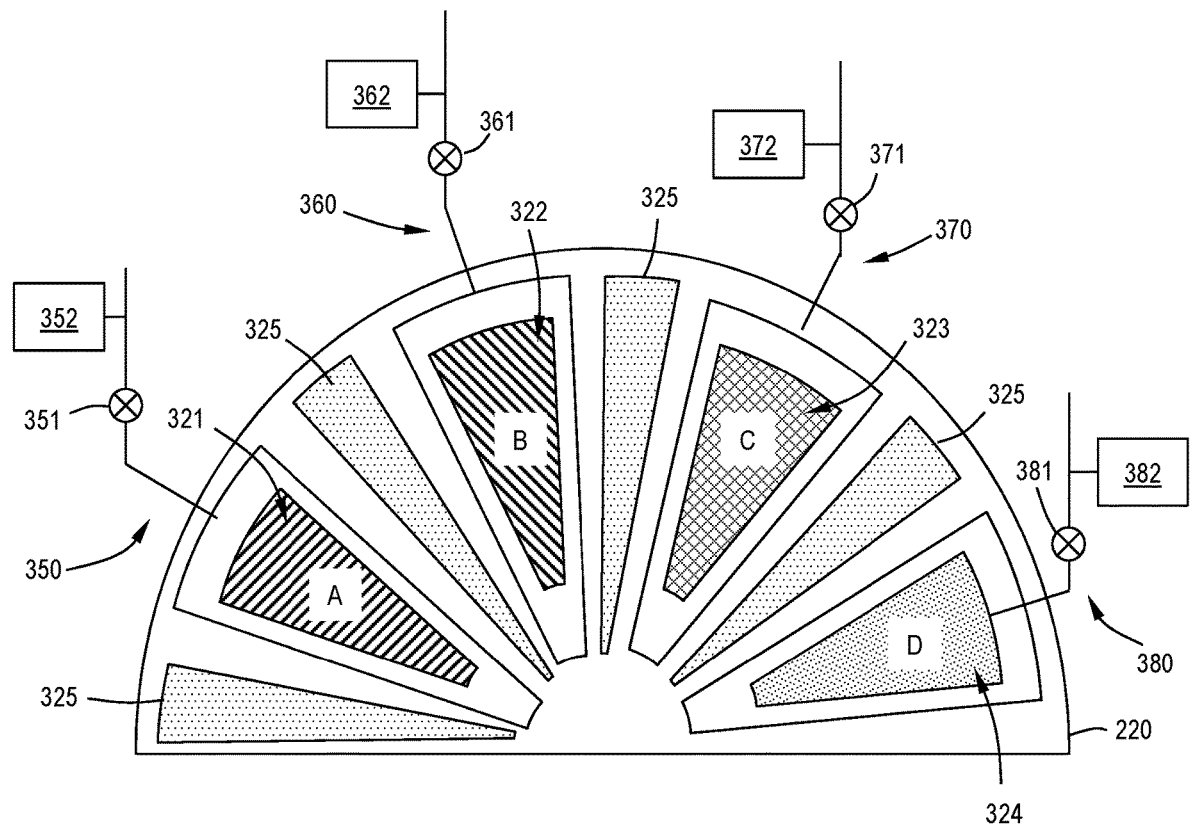
FIG. 11 shows a schematic view of a processing chamber in accordance with one or more embodiment of the disclosure.

FIG. 11 shows another embodiment of the disclosure in which the first pressure gauge 352 is an absolute gauge positioned upstream of the first throttle valve 351 and each of the second pressure gauge 362, the third pressure gauge 372 and the fourth pressure gauge 382 are differential pressure gauges that measure the pressure differential relative to the first pressure gauge.

Figure 12:
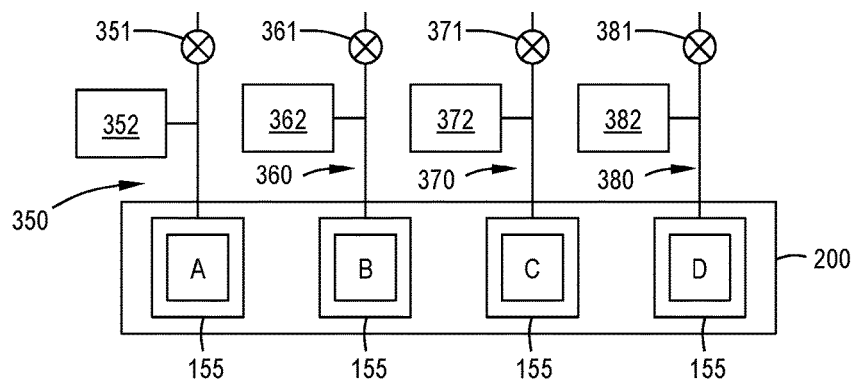
FIG. 12 shows a schematic view of a processing chamber in accordance with one or more embodiment of the disclosure.

FIG. 12 shows another embodiment of the disclosure in which the first pressure gauge 352 is an absolute gauge positioned downstream of the first throttle valve 351 and the second pressure gauge 362 is an absolute gauge positioned downstream of the second throttle valve 361. The third pressure gauge 372 is a differential gauge measuring a pressure differential relative to the first pressure gauge 352. The fourth pressure gauge 382 is a differential gauge measuring a pressure differential relative to the second pressure gauge 362. Embodiments of this sort may be, but are not necessarily, used where the first process gas and the third process gas are the same and where the second process gas and the fourth process gas are the same.

The controller 390 of some embodiments controls all of the throttle valves for each of the processing regions and for the processing volume. In some embodiments, there are four different processing regions (i.e., four different processing conditions) and the controller 390 maintains the pressure in all four processing regions and the processing chamber volume so that each region is isolated from adjacent regions by a gas curtain.

The position of the pressure gauges can be varied to before (upstream of) or after (downstream of) the throttle valves. When the pressure gauge is before the throttle valve, in some embodiments, the pressure gauge is positioned as close to the processing region as possible.

The exposure to the first process conditions and the second process conditions can be repeated sequentially to grow a film of predetermined thickness. For example, the batch processing chamber may contain two sections with the first process conditions and two sections of the second process conditions in alternating pattern, so that rotation of the substrate around the central axis of the processing chamber causes the surface to be sequentially and repeatedly exposed to the first and second process conditions so that each exposure causes the film thickness (for depositions) to grow.

In some embodiments, one or more layers may be formed during a plasma enhanced atomic layer deposition (PEALD) process. The use of plasma may provide sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the predetermined separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. An exhaust system comprising:
   a first exhaust system in fluid communication with a first processing region of a processing chamber, the first exhaust system comprising a first throttle valve and a first pressure gauge;
   a second exhaust system in fluid communication with a second processing region of the processing chamber, the second exhaust system comprising a second throttle valve and a second pressure gauge; and
   a controller in communication with the first exhaust system and the second exhaust system and configured to control the first throttle valve and the second throttle valve in response to signals from the first pressure gauge and the second pressure gauge, respectively, the controller further configured to ensure that an amount of gas supplied to each of the first processing region and the second processing region is equal to an amount of gas removed from each of the first processing region and the second processing region.

2. The exhaust system of claim 1, wherein at least one of the first pressure gauge and the second pressure gauge is upstream of a respective throttle valve.

3. The exhaust system of claim 1, wherein at least one of the first pressure gauge and the second pressure gauge is downstream of a respective throttle valve.

4. The exhaust system of claim 1, wherein the first pressure gauge is upstream of the first throttle valve and the second pressure gauge is upstream of the second throttle valve.

5. The exhaust system of claim 1, wherein the first pressure gauge is downstream of the first throttle valve and the second pressure gauge is downstream of the second throttle valve.

6. The exhaust system of claim 1, wherein the first pressure gauge and the second pressure gauge are absolute gauges.

7. The exhaust system of claim 1, wherein the first pressure gauge is an absolute gauge, and the second pressure gauge is a differential pressure gauge.

8. The exhaust system of claim 1, wherein an absolute pressure differential between the first processing region and the second processing region is less than or equal to about 5 torr.

9. The exhaust system of claim 1, wherein the controller is further configured to maintain separation of gases in the first processing region and the second processing region.

10. The exhaust system of claim 1, further comprising a chamber exhaust system in fluid communication with the processing chamber and a vacuum source, the chamber exhaust system comprising a chamber exhaust throttle valve downstream of the processing chamber and upstream of the vacuum source.

11. The exhaust system of claim 1, further comprising:
    a third exhaust system in fluid communication with a third processing region of the processing chamber, the third exhaust system comprising a third throttle valve and a third pressure gauge; and
    a fourth exhaust system in fluid communication with a fourth processing region of the processing chamber, the fourth exhaust system comprising a fourth throttle valve and a fourth pressure gauge, wherein the controller is also in communication with the third exhaust system and the fourth exhaust system to control the third throttle valve and the fourth throttle valve in response to signals from the third pressure gauge and the fourth pressure gauge, respectively.

12. The exhaust system of claim 11, wherein at least one of the first pressure gauge, the second pressure gauge, the third pressure gauge or the fourth pressure gauge is upstream of a respective throttle valve.

13. The exhaust system of claim 11, wherein each of the first pressure gauge, the second pressure gauge, the third pressure gauge and the fourth pressure gauge are upstream of each respective throttle valve.

14. The exhaust system of claim 11, wherein at least one of the first pressure gauge, the second pressure gauge, the third pressure gauge or the fourth pressure gauge is downstream of a respective throttle valve.

15. The exhaust system of claim 11, wherein each of the first pressure gauge, the second pressure gauge, the third pressure gauge and the fourth pressure gauge are downstream of each respective throttle valve.

16. The exhaust system of claim 11, wherein each of first pressure gauge, the second pressure gauge, the third pressure gauge and the fourth pressure gauge are absolute gauges.

17. The exhaust system of claim 11, wherein the first pressure gauge is an absolute gauge, the second pressure gauge is a differential pressure gauge measuring a pressure differential relative to the first pressure gauge, the third pressure gauge is an absolute gauge, and the fourth pressure gauge is a differential pressure gauge measuring a pressure differential relative to the third pressure gauge.

18. The exhaust system of claim 11, wherein the third pressure gauge and the fourth pressure gauge are a differential pressure gauges measuring a pressure differential relative to the first pressure gauge.

19. The exhaust system of claim 11, wherein the controller is further configured to maintain separation of gases in the third processing region and the fourth processing region.

* * * * *